(12) United States Patent
Li

(10) Patent No.: US 10,012,870 B2
(45) Date of Patent: Jul. 3, 2018

(54) ALIGNMENT DEVICE AND MANUFACTURING METHOD OF ALIGNMENT FILM AND DISPLAY SUBSTRATE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Hongpeng Li, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

(*) Notice: Subject to any disclaimer, the term of this patent is extended or adjusted under 35 U.S.C. 154(b) by 0 days.

(21) Appl. No.: 15/222,228

(22) Filed: Jul. 28, 2016

(65) Prior Publication Data

US 2017/0212392 A1 Jul. 27, 2017

(30) Foreign Application Priority Data

Jan. 27, 2016 (CN) .......................... 2016 1 0056242

(51) Int. Cl.
| G02F 1/1337 | (2006.01) |
| G03B 27/32 | (2006.01) |
| G03B 27/54 | (2006.01) |
| G03B 27/72 | (2006.01) |
| G02F 1/1339 | (2006.01) |
| G02F 1/161 | (2006.01) |
| B05D 3/02 | (2006.01) |
| B05D 3/06 | (2006.01) |
| B05D 3/12 | (2006.01) |

(Continued)

(52) U.S. Cl.
CPC ..... *G02F 1/133788* (2013.01); *B05D 3/0254* (2013.01); *B05D 3/065* (2013.01); *B05D 3/12* (2013.01); *G02F 1/1303* (2013.01); *G02F 1/1339* (2013.01); *G02F 1/133784* (2013.01); *G02F 1/161* (2013.01); *G03F 7/7035* (2013.01)

(58) Field of Classification Search
CPC ........ B05D 3/0254; B05D 3/065; B05D 3/12; G02F 1/1303; G02F 1/1337; G02F 1/133784; G02F 1/133788; G02F 1/1339; G02F 1/161; G03F 7/7035
USPC ...... 349/84, 122, 123, 153, 187; 355/67, 71, 355/77, 78, 84
See application file for complete search history.

(56) References Cited

U.S. PATENT DOCUMENTS

| 2009/0021681 A1* | 1/2009 | Yun ........................ G02F 1/1339 349/128 |
| 2014/0057200 A1* | 2/2014 | Lin ................... G02F 1/133788 430/20 |
| 2014/0072904 A1* | 3/2014 | Takano ..................... G03F 1/42 430/5 |

FOREIGN PATENT DOCUMENTS

CN 104155805 A 11/2014

* cited by examiner

*Primary Examiner* — Colin Kreutzer
(74) *Attorney, Agent, or Firm* — Harness, Dickey & Pierce, P.L.C.

(57) ABSTRACT

This disclosure discloses an alignment device and a method of manufacturing an alignment film, and a display substrate. The alignment device comprises a first exposure chamber that contains a first light box and a light-shielding plate for blocking light emitted from the first light box from irradiating the alignment region of the alignment film. The light emitted from the first light box is used to irradiate a (Continued)

non-alignment region so as to eliminate the alignment film in the non-alignment region.

12 Claims, 3 Drawing Sheets

(51) Int. Cl.
　　*G02F 1/13*　　　(2006.01)
　　*G03F 7/20*　　　(2006.01)

ALIGNMENT DEVICE AND MANUFACTURING METHOD OF ALIGNMENT FILM AND DISPLAY SUBSTRATE

CROSS-REFERENCE TO RELATED APPLICATION

This application claims a priority to Chinese Patent Application No. 201610056242.1 filed on Jan. 27, 2016, the disclosures of which are incorporated in their entirety by reference herein.

TECHNICAL FIELD

The present disclosure relates to the field of crystal display technology, in particular to an alignment device and a method of manufacturing an alignment film using the alignment device, and a display device.

BACKGROUND

A main structure of a panel for a thin film transistor-liquid crystal display (TFT-LCD) comprises an array substrate and a color filter substrate which are arranged to form a cell in an aligning manner, and a layer of crystal liquid sandwiched between the array substrate and the color filter substrate. Alignment films are arranged on inner surfaces of the array substrate and the color filter substrate. Alignment grooves are provided on surfaces of the alignment films to anchor liquid crystal molecules and provide a pretilt angle for the liquid crystal molecules. In existing technologies, the technology for aligning an alignment film comprises rubbing alignment technology and optical alignment technology. The optical alignment technology is a non-contact alignment process in which an alignment film is aligned by exposure to UV light. The optical alignment technology will not result in the generation of debris during the rubbing alignment process or adverse impact caused by static electricity, and the pretilt angle for liquid crystal is very small, thus image quality is very good. Therefore, the optical alignment technology is more and more widely used.

When the optical alignment technology is applied to vehicle-mounted liquid crystal display products or TV liquid crystal display products, due to high generation line and large-sized substrate of these products, the precision of control over edges in the coating process for the alignment film is very low. Therefore, when a sealant and the alignment films have a large overlap area after the array substrate and the color filter substrate are aligned to form a cell, the sealant is liable to peel off and conditions of the frame are poor. In order to overcome these technical problems, an optical alignment device may be revamped. However, the cost for the revamping is high, and debugging both during and after the revamping will affect the capacity.

SUMMARY

The present disclosure provides an alignment device and a method of manufacturing an alignment film, and a display substrate, so as to solve the problems that the precision of control over edges of the alignment film is low, the sealant is liable to peel off and conditions of frame are poor.

In order to solve these technical problems, the present disclosure provides the following technical solutions.

According to one aspect of the present disclosure, it provides an alignment device for aligning an alignment film comprising an alignment region and a non-alignment region surrounding the alignment region, wherein the alignment device comprises a first exposure chamber that contains a first light box and a light-shielding plate for blocking light emitted from the first light box from irradiating the alignment region of the alignment film, and the light emitted from the first light box is used to irradiate the non-alignment region so as to eliminate the alignment film in the non-alignment region.

Optionally, the light-shielding plate has a larger area than the alignment region.

Optionally, the alignment film is an optical alignment film, and the alignment device further comprises a second exposure chamber for aligning the optical alignment film in the alignment region.

The second exposure chamber comprises a second light box, a mask plate having a light-transmissive stripe and a polarizer, wherein light emitted from the second light box is converted into linearly polarized light after passing through the polarizer, and after passing through the light-transmissive stripe, the linearly polarized light irradiates the optical alignment film to expose the optical alignment film, thereby forming an alignment groove in a surface of the optical alignment film in the alignment region.

Optionally, the polarizer is a metal mesh arranged in the transmission direction of light from the second light box.

Optionally, the alignment device further comprises a vacuum system which is configured to fix the light-shielding plate by means of vacuum adsorption.

Optionally, the light-shielding plate comprises a base which is provided with a trench on its surface, and the vacuum system creates a vacuum in the trench so as to adsorb the light-shielding plate.

Optionally, the light-shielding plate comprises a plurality of trenches arranged at intervals, and adjacent trenches are in communication with each other.

Optionally, the distance between the light-shielding plate and the alignment film is about 1 to 2 mm.

According to another aspect of the present disclosure, it further provides a method of manufacturing an alignment film comprising an alignment region and a non-alignment region surrounding the alignment region, using the alignment device as described above, and the manufacturing method comprises a step of aligning the alignment film in the alignment region, and further comprises a step of eliminating the alignment film in the non-alignment region.

Optionally, the step of eliminating the alignment film in the non-alignment film comprises:

in the first exposure chamber, aligning the light-shielding plate and the alignment region so as to block light from irradiating the alignment region of the alignment film and then exposing the non-alignment region to light so as to eliminate the alignment film in the non-alignment region.

Optionally, the alignment film is an optical alignment film, and the manufacturing method further comprises:

in the second exposure chamber, aligning the mask plate and the optical alignment film and then exposing the alignment region of the alignment film to linearly polarized light so as to form an alignment groove in a surface of the optical alignment film in the alignment region.

Optionally, in the manufacturing method of the embodiment of the present disclosure, an alignment groove is formed in the surface of the alignment film in the alignment region by a rubbing process.

According to a further aspect of the present disclosure, it further provides a display substrate comprising a display region and a non-display region surrounding the display region, wherein the display substrate comprises an alignment film located at a position corresponding to the display region of the display substrate.

The above-mentioned technical solutions of the present disclosure produce advantageous effects as follows: in the above-mentioned technical solutions of the present disclosure, an exposure chamber configured to eliminate the non-alignment region of the alignment film is added to the alignment device, which results in an increase in the precision of control over edges of the alignment film. Since it is only required to add the exposure chamber, the revamping is simple, no debugging is needed after the revamping, and the cost is low. When alignment films are formed on the array substrate and the color filter substrate using the alignment device of the present disclosure, the sealant will not overlap with the alignment films upon aligning the array substrate and the color filter substrate to form a cell, thus overcoming the problems of the peeling off of the sealant due to its large overlap area with the alignment films and poor conditions of the frame.

BRIEF DESCRIPTION OF THE DRAWINGS

In order to explain the technical solutions of embodiments of the present disclosure or those in the prior art more clearly, accompanying drawings needed for describing the embodiments or the prior art are briefly introduced. Obviously, the drawings explained below merely represent some embodiments of the present disclosure, and a person having ordinary skills in the art can obtain other drawings from these drawings without exercising any inventive skill.

DETAILED DESCRIPTION

The present disclosure provides an alignment device configured to align an alignment film on a display substrate. The alignment device comprises a first exposure chamber for eliminating the alignment film in the non-alignment region, thereby resulting in an increase in the precision of control over edges of the alignment film. Since it is only required to add the exposure chamber, the revamping is simple, no debugging is needed after the revamping, and the cost is low. When alignment films are formed on the array substrate and the color filter substrate using the alignment device, the sealant will not overlap with the alignment films upon aligning the array substrate and the color filter substrate to form a cell, thus overcoming the problems of the peeling off of the sealant due to its large overlap area with the alignment films and poor conditions of the frame.

The technical solutions of the present disclosure are especially suitable for the vehicle-mounted liquid crystal display products, TV liquid crystal display products and other products with high-generation lines because these products have a large size and the coating process of the alignment film provides low precision of control over edges of the alignment film.

Below, embodiments of the present disclosure will be further described in detail with reference to the drawings and examples. The following examples are merely for illustrating the present disclosure, and not intended to limit the scope of the present disclosure.

Figure 1:
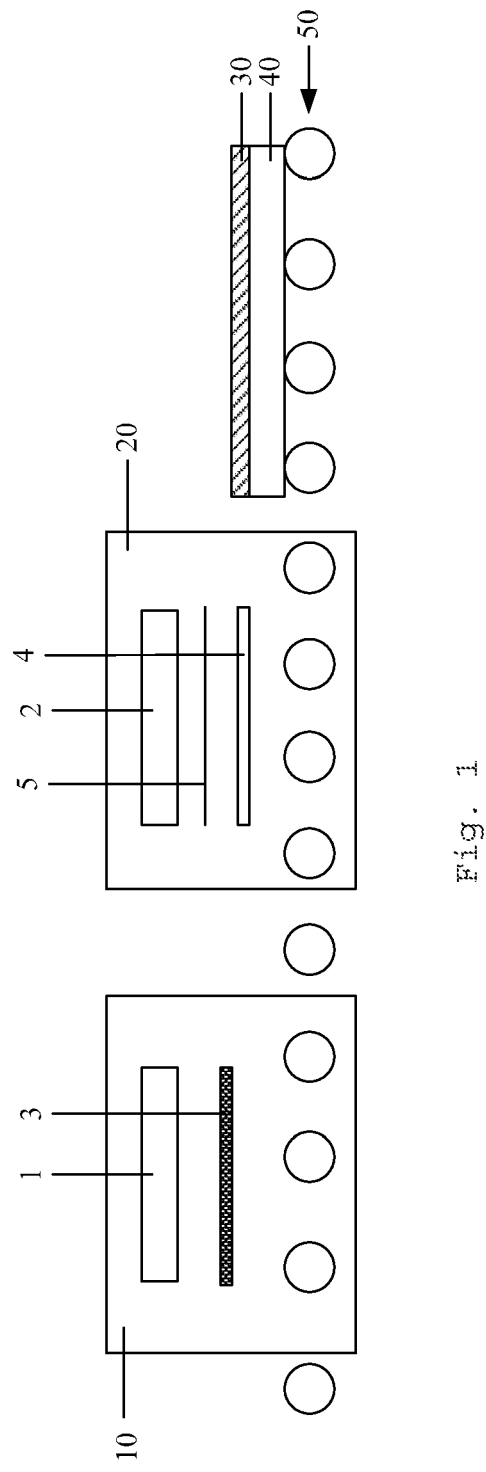
FIG. 1 shows a structural schematic diagram of an alignment device of an embodiment according to the present disclosure.

As shown in FIG. 1, the alignment device according to an embodiment of the present disclosure is configured to align the alignment film 30 in the alignment region. The alignment film 30 is formed on a display substrate 40, and the alignment region of the alignment film 30 is arranged directly opposite to a display region of the display substrate 40, so as to provide a pretilt angle for liquid crystal molecules. The alignment film 30 further comprises a non-alignment region surrounding the alignment region.

The alignment device comprises a first exposure chamber 10 for eliminating the alignment film 30 in the non-alignment region. The first exposure chamber 10 contains a first light box 1 and a light-shielding plate 3 for blocking light emitted from the first light box from irradiating the alignment region of the alignment film 30. Light emitted from the first light box 1 is used to irradiate the non-alignment region so as to eliminate the alignment film in the non-alignment region, thus resulting in an increase in the precision of control over edges of the alignment film. Since it is only required to add the first exposure chamber 10 to the alignment device, the revamping is simple, no debugging is needed after the revamping, and the cost is low.

Optionally, the first light box 1 may be a UV light source. In order to ensure the accuracy of exposure, the light-shielding plate 3 is arranged to be at a distance of 1 to 2 mm from the alignment film 30. Alignment marks may be formed on the light-shielding plate 3 so as to achieve the alignment between the light-shielding plate 3 and the alignment film 30. Specifically, since the alignment film 30 is formed on the display substrate 40, and the alignment region is arranged directly opposite to the display region of the display substrate 40, the alignment between the light-shielding plate 3 and the alignment film 30 is converted into the alignment between the light-shielding plate 3 and the display substrate 40.

Figure 3:
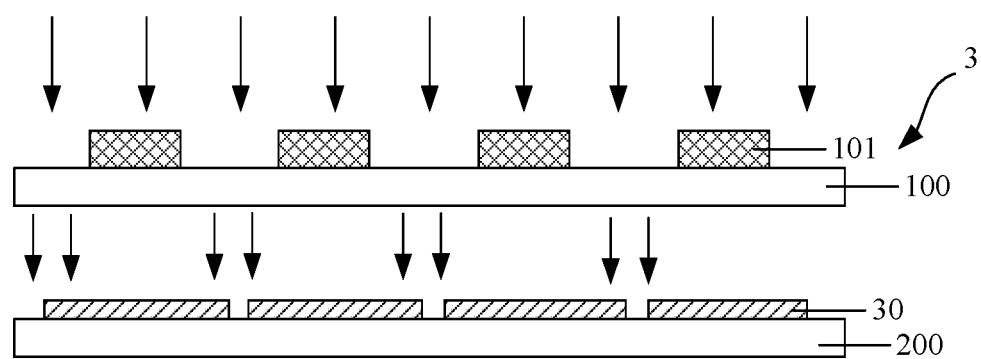
FIGS. 3 and 4 show schematic diagrams of a procedure of eliminating the alignment film in the non-alignment region according to an embodiment of the present disclosure.
Figure 4:
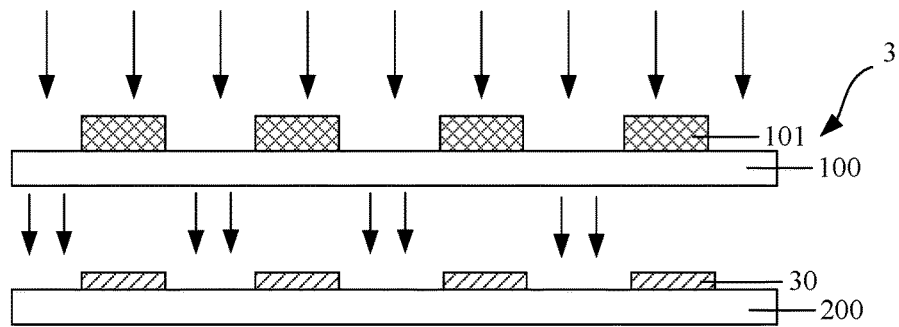

As shown in FIG. 4, the light-shielding plate 3 may be formed by forming a light-shielding layer 101 (such as an Al—Mo metallic layer) on a transparent base 100. The transparent base 100 may be a glass base, a quartz base, an organic resin base or the like. In a practical production line, a plurality of display substrates may be manufactured on a base 200 simultaneously, and then cut into independent display substrates. Accordingly, in this embodiment, a plurality of light-shielding layers 101 are formed on the transparent base 100, a plurality of light-shielding plates 3 are manufactured on the transparent base 100, and non-alignment regions of a plurality of alignment films 30 can be eliminated simultaneously, thus resulting in improved production efficiency and lowered cost. Please refer to FIGS. 3 and 4 for the process of eliminating the non-alignment region.

Figure 2:
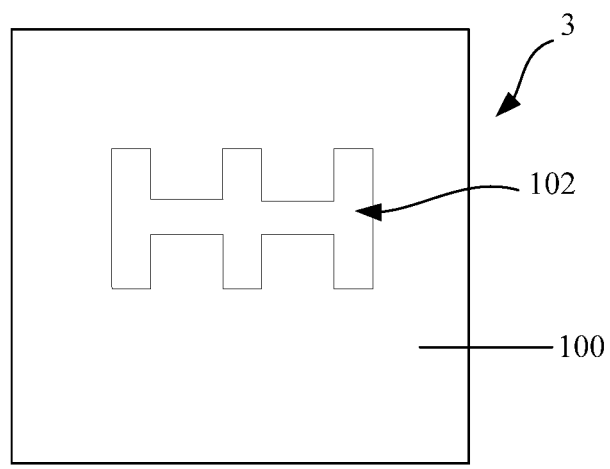
FIG. 2 shows a structural schematic diagram of a light-shielding plate of an embodiment of the present disclosure.

During the elimination of the non-alignment region of the alignment film 30 by an exposing process, the light-shielding plate 3 is required to be fixed between the first light box 1 and the alignment region of the alignment film 30. There are various structures for fixing the light-shielding plate 3. In this embodiment, the alignment device further comprises a vacuum system (not shown in the figures). The vacuum system allows the light-shielding plate 3 to be fixed by means of vacuum adsorption, and has a simple structure and is easy to install and remove. Further, referring to FIG. 2, trenches 3 are formed in a surface of the transparent base 100 of the light-shielding plate 3. The vacuum system creates a vacuum in the trench 3 so as to adsorb the light-shielding plate 3, thereby increasing the adsorption strength. In this embodiment, a plurality of trenches 3 are arranged at intervals, and adjacent trenches 3 are in communication with each other. The vacuum system creates a vacuum in the plurality of communicating trenches 3 to adsorb the light-shielding plate 3, thereby further increasing the adsorption strength.

Optionally, the trench 3 is arranged on a light-shielding pattern 101, and formed through a patterning process for the light-shielding pattern 101. Alternatively, the trench 3 may be arranged in a surface of the transparent base 100 opposite to the light-shielding pattern 101, and formed by etching the surface of the transparent base 100 using HF acid or other corrosive liquid. Specifically, a photoresist is formed on the surface of the transparent base 100, and then exposed to light and developed to form a photoresist-reserved region and a photoresist-not-reserved region. The photoresist-not-reserved region is located at a position corresponding to the region where the trench 3 is located, and the photoresist-reserved region corresponds to the other region. The transparent base 100 in the photoresist-not-reserved region is etched using HF acid or other corrosive liquid so as to form the trench 3, while the photoresist in the photoresist-reserved region protects the transparent base 100 in the region other than the region where the trench 3 is located from being corroded. Finally, the photoresist is peeled off.

In this embodiment, the vacuum system comprises a base platform (not shown in the figures), and allows the light-shielding plate 3 to be adsorbed onto the base platform by means of vacuum adsorption. Marks for alignment are made on the base platform, for example at four corners and a middle position of the base platform, to be aligned with the alignment marks on the light-shielding plate 3. The alignment derivation is controlled within a range of around ±5 micron. After the completion of the alignment between the light-shielding plate 3 and the base platform, the light-shielding plate 3 is adsorbed onto the base platform by means of vacuum adsorption, and is moved along with the movement of the base platform, so as to realize the alignment between the light-shielding plate 3 and the alignment region of the alignment film 30. The light-shielding plate 3 blocks light emitted from the light box from irradiating the alignment region, but only allows the light to irradiate the non-alignment region so as to eliminate the alignment film 30 in the non-alignment region. The alignment film 30 is formed on the display substrate 40, and the alignment region is arranged directly opposite to the display region of the display substrate 40, thus the alignment between the light-shielding plate 3 and the alignment film 30 is converted into the alignment between the light-shielding plate 3 and the display substrate 40.

In order to prevent the process of eliminating the alignment film in the non-alignment region from affecting the alignment film in the alignment region, the light-shielding plate 3 may be designed to have a slightly larger area than the alignment region. When a plurality of light-shielding plates 3 are simultaneously formed by forming a plurality of light-shielding layers 101 on the transparent base 100, the light-shielding layer 101 has a slightly larger area than the alignment region.

In this embodiment, the alignment film 30 in the alignment region may be aligned before or after the process of "eliminating the alignment film 30 in the non-alignment region", and both can be applied to the technical solution of the present disclosure and not defined here.

The alignment film 30 in the alignment region can be aligned through rubbing alignment process, optical alignment process or other alignment process.

As shown in FIG. 1, when the alignment film 30 is an optical alignment film, the alignment device further comprises a second exposure chamber 20 for aligning the alignment film 30 in the alignment region. The second exposure chamber 20 comprises a second light box 2, a mask plate 4 and a polarizer 5. Light emitted from the second light box 2 is converted into linearly polarized light after passing through the polarizer 5. The mask plate 4 has a light-transmissive stripe which allows the linearly polarized light to pass through and irradiate the alignment film, so as to form an alignment groove in the surface of the alignment film 30 in the alignment region, i.e., finishing the alignment.

The polarizer 5 may be, but is not limited to, a metal mesh arranged in the transmission direction of light from the second light box 2.

As shown in FIG. 1, in this embodiment, when the alignment film 30 is an optical alignment film, the alignment device specifically comprises:

a conveying means 50 to carry and convey the display substrate 40;

the second exposure chamber 20 comprising the second light box 2, the mask plate 4 and the polarizer 5; light emitted from the second light box 2 is converted into linearly polarized light after passing through the polarizer 5, and the linearly polarized light irradiates the alignment film 30 on the display substrate 40 after passing through the mask plate 4 so as to form an alignment groove in the alignment region of the alignment film 30, i.e., finishing the alignment; and the first exposure chamber 10 comprising a first light box 1 and a light-shielding plate 3 for blocking light from irradiating the alignment region of the alignment film 30, light emitted from the first light box 1 is used to irradiate the non-alignment region so as to eliminate the alignment film in the non-alignment region.

Other structures comprised in the alignment device are the same as those in the prior art, and will not be described here.

Referring to FIG. 1, according to another embodiment of the present disclosure, it provides a display substrate 40 comprising a display region and a non-display region surrounding the display region. The display region 40 comprises the alignment film 30 located at a position corresponding to the display region of the display substrate 40, that is, the alignment film comprises the alignment region only. In the manufacturing process, the alignment film 30 in the non-alignment region is eliminated. Therefore, the precision of control over edges of the alignment film 30 is increased, the process is simple, and there is no need to debug.

The display substrate 40 may be an array substrate or a color filter substrate of a liquid crystal display device, or other display substrate comprising an alignment film.

In this embodiment, when the alignment films on the array substrate and the color filter substrate comprise alignment regions only, the sealant will not overlap with the alignment film upon aligning the array substrate and the color filter substrate to form a cell. Therefore, the embodiment of the present disclosure overcomes the problems of the peeling off of the sealant due to its large overlap area with the alignment films and poor conditions of the frame, and improves the product quality.

Optionally, the alignment film 30 has a slightly larger area than the display region so as to ensure that the process of eliminating the alignment film 30 in the non-alignment region will not affect the alignment film 30 in the alignment region.

According to another embodiment of the present disclosure, it provides a method of manufacturing an alignment film comprising an alignment region and a non-alignment region surrounding the alignment region, using the alignment device described in the above embodiment, wherein the manufacturing method comprises a step of aligning the alignment film in the alignment region, and further a step of eliminating the alignment film in the non-alignment region.

The alignment film manufactured using the above manufacturing method comprises an alignment region only, and the peripheral non-alignment region are eliminated, thereby resulting in an increase in the precision of control over edges of the alignment film. Since the method requires only the addition of the step of eliminating the alignment film in the non-alignment region, the method is simple, there is no need to debug and the cost is low. When this manufacturing method is used to form alignment films on the array substrate and the color filter substrate, the sealant will not overlap with the alignment films upon aligning the array substrate and the color filter substrate to form a cell, thus overcoming the problems of the peeling off of the sealant due to its large overlap area with the alignment films and poor conditions of the frame.

The step of eliminating the alignment film in the non-alignment region comprises:

in the first exposure chamber, aligning the light-shielding plate and the alignment region so as to block light from irradiating the alignment region of the alignment film and then exposing the non-alignment region to light so as to eliminate the alignment film in the non-alignment region.

Specially, a process is selected according to the material of the alignment film so as to eliminate the alignment film in the non-alignment region. For example, when the alignment film is an optical alignment film, the alignment film in the non-alignment region may be eliminated by a high-temperature or cleaning process.

In this example, the alignment film in the alignment region may be aligned before or after the process of "eliminating the alignment film in the non-alignment region", and both can be applied to the technical solution of the present disclosure and not defined here.

When the alignment film is an optical alignment film, the alignment film in the alignment region will be aligned by optical alignment technology.

Specifically, in the second exposure chamber, the mask plate and the optical alignment film are aligned, and then the alignment region of the optical alignment film is exposed to linearly polarized light so as to form an alignment groove in a surface of the optical alignment film in the alignment region.

The principle of the optical alignment technology is as follows: after the formation of the optical alignment film and before the irradiation with polarized UV light, molecular chains on the surface of the alignment film are arranged at random, and do not have the capacity of aligning liquid crystal molecules. The optical alignment film is irradiated by the linearly polarized UV light (the wavelength is 254 nm), so that molecules of the optical alignment film oriented in a certain direction are decomposed or polymerized. An alignment groove is formed in the surface of the alignment film after products resulting from the decomposition or polymerization are removed using a high-temperature or cleaning process. The alignment film or optical alignment film has the capacity of aligning liquid crystal molecules. The optical alignment film has a UV photosensitive group, and it will be decomposed or polymerized under the irradiation of UV light in a manner matching the polarization direction of the UV light.

A well-proven optical alignment technology is photodecomposition technology of Nissan which is based mainly on a class of optical alignment material. Such kind of material is decomposed under irradiation with linearly polarized UV light. A specific photosensitive group is decomposed as follows:

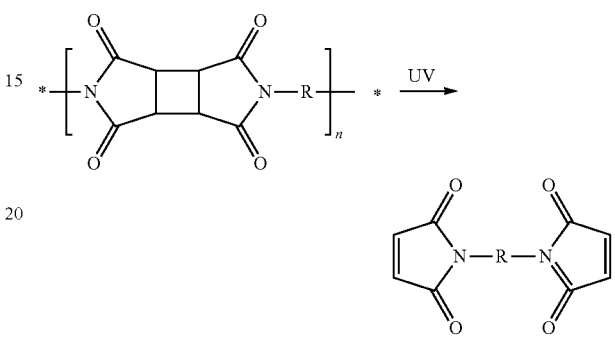

A typical one of such kind of material is Nissan D126 PI liquid which has been produced in large scale in BOE (BOE TECHNOLOGY GROUP CO LTD).

Alternatively, the alignment film can be aligned by a rubbing process or other alignment process.

Figure 5:
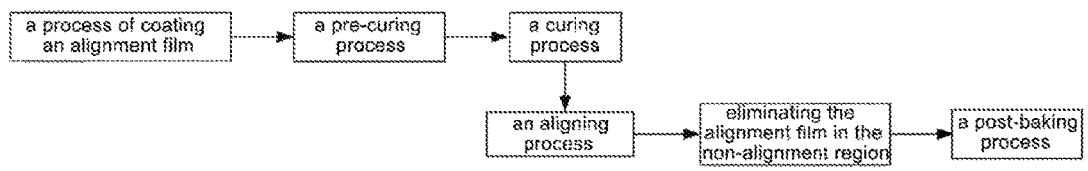
FIG. 5 shows a flow diagram of the manufacturing process of an alignment film according to an embodiment of the present disclosure.

In this embodiment, as shown in FIG. 5, when the alignment film is an optical alignment film, it is manufactured as follows:

coating an alignment film on the display substrate;

pre-curing the alignment film at 80 to 120 degrees Celsius;

curing the alignment film at 230 degrees Celsius;

irradiating the alignment region of the alignment film using linearly polarized UV light so as to decompose molecules of the alignment film oriented in a certain direction, and removing the decomposition product under a high temperature so as to form an alignment groove in the surface of the alignment film, i.e., finishing the alignment;

aligning the light-shielding plate and the alignment region of the alignment film, irradiating the non-alignment region of the alignment film with UV light (nature light) which have passed through the light-shielding plate so as to decompose the alignment film molecules in the non-alignment region, and removing the resulting decomposition product under a high temperature, i.e., eliminating the alignment film in the non-alignment region; and subjecting the alignment film to a post-baking process at 230 degrees Celsius.

Thus, the manufacturing of an alignment film is completed.

The above are optional embodiments of the present disclosure. It shall be indicated that a person having ordinary skills in the art may make several improvements and replacements without departing from the technical principle of the present disclosure, and such improvements and replacements should be also deemed to be encompassed within the protection scope of the present disclosure.

What is claimed is:

1. An alignment device which is configured to align an alignment film of a display substrate comprising an alignment region and a non-alignment region surrounding the alignment region, wherein the alignment device comprises:
- a first exposure chamber that contains a first light box and a light-shielding plate for blocking light emitted from the first light box from irradiating the alignment region of the alignment film, and the light emitted from the first light box is used to irradiate the non-alignment region so as to eliminate the alignment film in the non-alignment region;
- a second exposure chamber for aligning the alignment film in the alignment region;
- a conveying means for carrying and conveying the display substrate into or out of the first exposure chamber and the second exposure chamber; and
- a vacuum system which is configured to fix the light-shielding plate by means of vacuum adsorption,
- wherein the light-shielding plate comprises a base which is provided with a trench in its surface, and the vacuum system creates a vacuum in the trench so as to adsorb the light-shielding plate; and
- wherein the light-shielding plate comprises a plurality of parallel trenches arranged at intervals, and adjacent parallel trenches are in communication with each other by a perpendicular trench whose extension direction is perpendicular to the extension direction of the parallel trenches.

2. The alignment device according to claim 1, wherein the light-shielding plate has a larger area than the alignment region.

3. The alignment device according to claim 1, wherein the alignment film is an optical alignment film;
the second exposure chamber comprises a second light box, a mask plate having a light-transmissive stripe and a polarizer, wherein light emitted from the second light box is converted into a linearly polarized light after passing through the polarizer, and after passing through the light-transmissive stripe, the linearly polarized light irradiates the optical alignment film to expose the optical alignment film, thereby forming an alignment groove in a surface of the optical alignment film in the alignment region.

4. The alignment device according to claim 3, wherein the polarizer is a metal mesh arranged in a transmission direction of light from the second light box.

5. The alignment device according to claim 1, wherein a distance between the light-shielding plate and the alignment film is more than 1 mm and less than 2 mm.

6. A method of manufacturing an alignment film of a display substrate comprising an alignment region and a non-alignment region surrounding the alignment region, using the alignment device according to claim 1, the manufacturing method comprises aligning the alignment film in the alignment region in the second exposure chamber; carrying the display substrate from the second exposure chamber to the first exposure chamber; and eliminating the alignment film in the non-alignment region in the first exposure chamber,
- wherein the alignment device further comprises a vacuum system which is configured to fix the light-shielding plate by means of vacuum adsorption,
- wherein the light-shielding olate comprises a base which is provided with a trench in its surface, and the vacuum system creates a vacuum in the trench so as to adsorb the light-shielding plate
- wherein the light-shielding plate comprises a plurality of parallel trenches arranged at intervals, and adjacent parallel trenches are in communication with each other by a perpendicular trench whose extension direction is perpendicular to the extension direction of the parallel trenches.

7. The method according to claim 6, wherein the light-shielding plate has a larger area than the alignment region.

8. The method according to claim 6, wherein the alignment film is an optical alignment film;
the second exposure chamber comprises a second light box, a mask plate having a light-transmissive stripe and a polarizer, wherein light emitted from the second light box is converted into a linearly polarized light after passing through the polarizer, and after passing through the light-transmissive stripe, the linearly polarized light irradiates the optical alignment film to expose the optical alignment film, thereby forming an alignment groove in a surface of the optical alignment film in the alignment region.

9. The method according to claim 8, wherein the polarizer is a metal mesh arranged in a transmission direction of light from the second light box.

10. The method according to claim 6, wherein a distance between the light-shielding plate and the alignment film is more than 1 mm and less than 2 mm.

11. The method according to claim 6, wherein the step of eliminating the alignment film in the non-alignment region comprises:
in the first exposure chamber, aligning the light-shielding plate and the alignment region so as to block light from irradiating the alignment region of the alignment film and then exposing the non-alignment region to light so as to eliminate the alignment film in the non-alignment region.

12. The method according to claim 11, wherein the alignment film is an optical alignment film, and the manufacturing method further comprises:
in the second exposure chamber, aligning the mask plate and the optical alignment film and then exposing the alignment region of the alignment film to linearly polarized light so as to form an alignment groove in a surface of the optical alignment film in the alignment region.

* * * * *